(12) United States Patent
Baier et al.

(10) Patent No.: US 7,564,150 B2
(45) Date of Patent: Jul. 21, 2009

(54) CONTROL DEVICE FOR AN ELECTRICAL APPLIANCE AND CONTROL METHOD

(75) Inventors: Martin Baier, Ettlingen (DE); Markus Jungbauer, Bruchsal-Obergrombach (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 83 days.

(21) Appl. No.: 11/938,964

(22) Filed: Nov. 13, 2007

(65) Prior Publication Data

US 2008/0111428 A1 May 15, 2008

(30) Foreign Application Priority Data

Nov. 14, 2006 (DE) .................. 10 2006 054 764

(51) Int. Cl.
*H01H 31/10* (2006.01)
(52) U.S. Cl. ..................................... 307/115
(58) Field of Classification Search ............... 307/115
See application file for complete search history.

(56) References Cited

U.S. PATENT DOCUMENTS

| | | | |
|---|---|---|---|
| 4,204,204 A | 5/1980 | Pitstick | |
| 6,153,837 A | 11/2000 | Garcia et al. | |
| 2006/0038793 A1 | 2/2006 | Philipp | |
| 2007/0181410 A1 | 8/2007 | Baier | |

FOREIGN PATENT DOCUMENTS

| | | |
|---|---|---|
| DE | 7828940 | 2/1979 |
| DE | 10330912 | 2/2005 |
| DE | 20 2004 017 133 | 3/2005 |
| GB | 1 603 862 | 12/1981 |
| WO | WO 2005/019766 A2 | 3/2005 |

OTHER PUBLICATIONS

German Search Report from German Application No. 10 2006 054 764.0.

*Primary Examiner*—Robert L. Deberadinis
(74) *Attorney, Agent, or Firm*—Alston & Bird LLP

(57) ABSTRACT

A control device for an electric hob has a control element placed on a support. Circular ring segmental surfaces are provided as signal generators beneath the support. On the top side and underside, the control element has numerous electrically interconnected, circular ring segmental surfaces, the lower surfaces being above the signal generators during rotation. The application of a finger to a contact surface on the control element top side is directly coupled to a sensor surface on the control element underside and can be capacitively detected by a directly facing signal generator and evaluated as a corresponding control function by a control device.

16 Claims, 2 Drawing Sheets

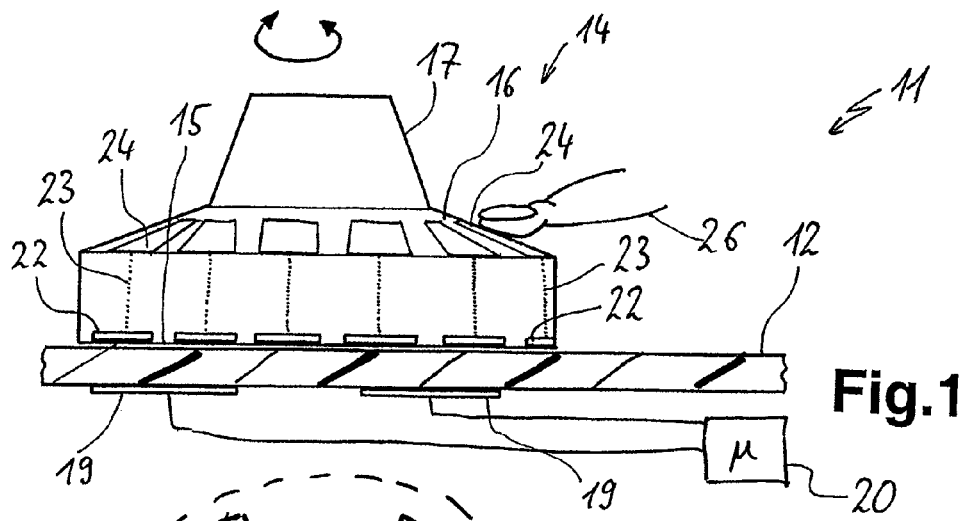
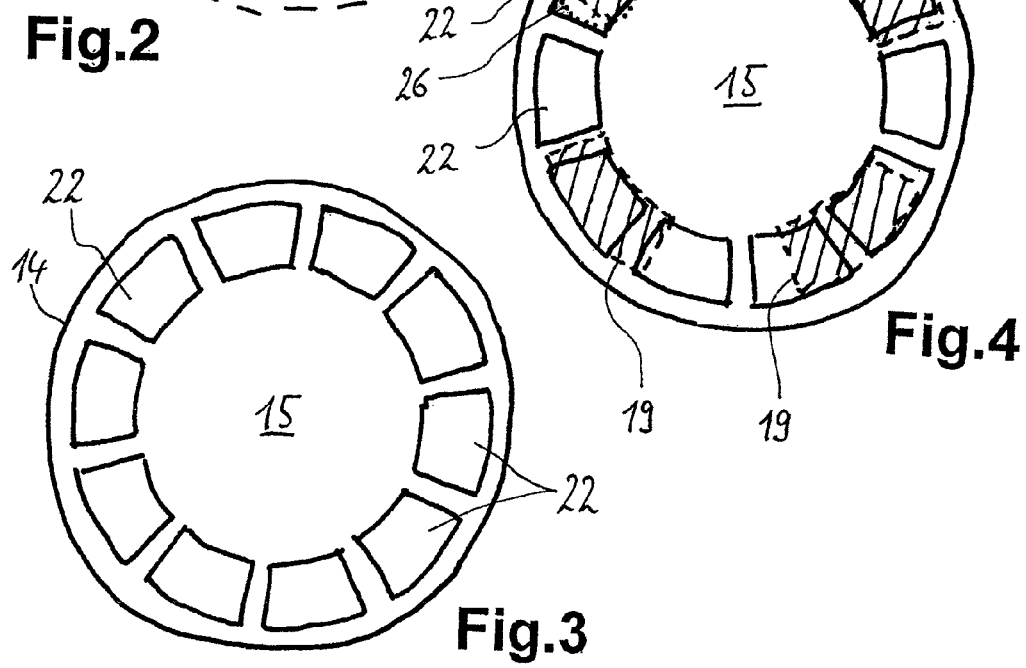

CONTROL DEVICE FOR AN ELECTRICAL APPLIANCE AND CONTROL METHOD

CROSS REFERENCE TO RELATED APPLICATIONS

This application is based on German Application No. 102006054764.0 filed on Nov. 14, 2006, of which the contents are hereby incorporated by reference.

FIELD OF INVENTION

The invention relates to a control device for an electrical appliance, for example an electrical heating device such as a hob, as well as a control method for operating the control device.

BACKGROUND FOR THE INVENTION

A similar control device is known, for example, from US 2007/0181410 A1. A signal generated by a signal generator beneath the support is capacitively transmitted to a conductive sensor surface on the underside of the control element. Said sensor surface is electrically contacted to a contact surface on the top side of the control element. If the contact surface is contacted by a finger, as a result, the signal generator signal applied thereto is changed. By means of the direct connection with the sensor surface, said signal change is retransmitted to the signal generator and can be evaluated.

Problem and Solution

A problem addressed by the invention is to provide an aforementioned control device and a corresponding operating method making it possible to avoid the disadvantages of the prior art and in particular enabling a control to be recognized and evaluated.

BRIEF DESCRIPTION OF THE DRAWINGS

Embodiments of the invention are described in greater detail hereinafter relative to the diagrammatic drawings, wherein:

FIG. 1 illustrates a lateral representation of an inventive control device with a first embodiment of the control element as a rotary toggle;

FIG. 2 illustrates a plan view from below of the support with signal generators constructed as circular ring segmental surfaces;

FIG. 3 illustrates a plan view of the underside of the control element of FIG. 1 with circular ring segmental surfaces as sensor surfaces;

FIG. 4 illustrates the views of FIGS. 2 and 3 combined;

DETAILED DESCRIPTION OF THE EMBODIMENTS

Figure 5:
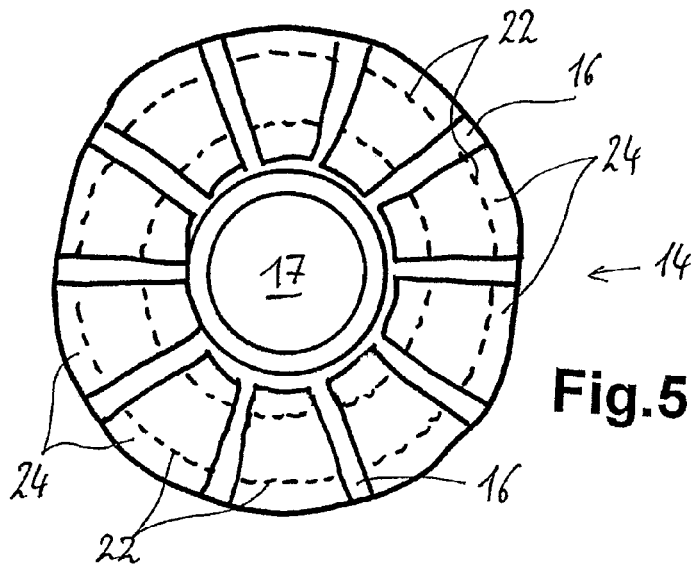
FIG. 5 illustrates a plan view of the control element of FIG. 1 from above with contact surfaces electrically connected to the sensor surfaces.

This problem is solved in one embodiment by a control device having the features of claim 1 and 13 and a control method having the features of claim 14. Advantageous and preferred embodiments of the invention form the subject matter of the further claims and are explained in greater detail hereinafter. By express reference the wording of the claims is made into part of the content of the description.

The control device has a movable control element, which is removable and rests with a control element underside on a support. There is a contactless, capacitive signal coupling between sensor surfaces beneath the control element and signal generators on or beneath the support. The sensor surfaces are connected with contact surfaces on the top of the control element, which are contacted by an operator and can be triggered or operated for a control function. Advantageously, each sensor surface is connected to a contact surface. Several signal generators are arranged along a circle on the support, the sensor surfaces being located on a concentric circle corresponding thereto on the control element. According to the invention, several sensor surfaces are provided as signal generators. It is consequently possible, in the case of a rotary control element and independently of the relative rotation position of said control element, to contact a contact surface at an absolutely fixed location, which can be detected by the less finely distributed signal generators. The sensor surfaces and signal generators can be constructed in such a way that a signal transmission not only takes place when a sensor surface is precisely above the signal generator, but in certain circumstances when it is also slightly laterally displaced or even when there is no precise overlap or coverage of one signal generator, but instead between two signal generators.

According to a development of the invention there can be far more sensor surfaces than signal generators, for example, twice as many or even more. It is possible for there to be at least ten or twelve sensor surfaces and also contact surfaces and, for example, only four signal generators. The surfaces and signal generators can advantageously be present in the form of circular ring segmental surfaces of metal or conductive material. In particular, the contact surfaces and sensor surfaces can be advantageously in the form of narrow, radially directed strips. They can also be in the form of segments or sections embedded in a plastic body running from the top side to the underside of the control element. Thus, the contact surfaces and sensor surfaces are formed as a single unit. In the upwards direction, the contact surfaces can also be provided with a thin covering, for example as a protection or for decoration, but this does not impair the function.

The sensor surfaces and contact surfaces can be evenly distributed, i.e., equidistant to one another and this also applies to the signal generators. Between adjacent sensor surfaces there should at least be small gaps. Between adjacent signal generators there should be larger gaps, because in particular, as a result of said larger gaps between the signal generators, it is possible to achieve a more precise detection of a position of sensor surfaces above the same. In another embodiment, the gaps between adjacent signal generators can be roughly as large as the width of a signal generator or even larger. However, advantageously, they are narrower, so that a sensor surface always at least partly covers at least one signal generator. This permits a precise differentiation of sensor surfaces above the same and the detection thereof.

Advantageously, the circles on which the sensor surfaces and signal generators are positioned are of the same size and are consequently superimposed. With particular advantage, said circles are somewhat smaller than the outer circumference of the control element, so that in particular the sensor surfaces can be located within the control element and around the same within its border. They can downwardly be provided with a covering.

According to another embodiment of the invention, the sensor surfaces and signal generators can be capacitively coupled. It is in particular advantageously possible for the sensor surfaces to be electrically contactable by means of the contact surfaces on the control element by a finger of an operator applied to the control element or contact surfaces. To this end, the contact surfaces are electrically connected to the sensor surfaces. The contact of the contact surfaces on the control element can consequently be established and detected by the capacitive signal generators as a result of the capacitive coupling between sensor surfaces and signal generators and, as a result, a correspondingly established control function can be initiated. One contact surface is provided for each sensor surface.

According to another independent inventive aspect in the case of an aforementioned control device with the features of the preamble of claim 1, a signal generator for capacitive signal coupling can be provided on the support, which has an elongated or circular ring shape in the form of a so-called capacitive slider, such as is for example known from US 2007/0144877 A1 or US 2004/0104826 A1, to which express reference is made in this connection. Said slider then counts as a signal generator. There are several sensor surfaces and contact surfaces on the control element.

In an advantageous control method in the case of an electrical appliance in the form of a hob with several hotplates, firstly one of the contact surfaces on the control element is contacted for selecting a hotplate via the establishment of the contact through the sensor surface and signal generator. Then, by moving the control element, particularly by rotation, a power stage, operating duration or operating delay for this hotplate is set. A selection takes place with the location of the first contact of the control element.

In the aforementioned method, it is possible during the movement of the control element, for example for the power level, for the contact surface to be continuously contacted by an applied finger. Thus, the selected hotplate is maintained in this selection state. According to an alternative embodiment, the contact surface is no longer contacted during control element movement. Whereas in the first-mentioned case by operation and further contacting during the control method, there is a switching to the next plane in which setting takes place, whereas in the last-mentioned method by a single short contacting or operation, switching to the next higher plane occurs and there is then no need to maintain this state.

According to a further development of the invention, it is also possible to detect control element rotation. This can easily take place optically, as is for example known from DE 10330912 A1, to which express reference is made.

These and further features can be gathered from the claims, description and drawings and individual features, both singly or in the form of subcombinations, can be implemented in an embodiment of the invention and in other fields and can represent advantageous, independently protectable constructions for which protection is claimed here. The subdivision of the application into individual sections and the subheadings in no way restricts the general validity of the statements made thereunder.

FIG. 1 shows a control device 11 according to the invention. The underside 15 of a control element 14 is placed on a support 12, which according to the aforementioned prior art can be a glass ceramic electric hob hotplate and whose retaining by means of magnetic force or the like is known from the prior art, for example the aforementioned US 2007/0181410 A1. Express incorporation by reference is made thereto, so that no further details are needed here. It is a matter of detecting a rotary movement or rotary position. Apart from the underside 15, the control element 14 has a top side 16, which slightly rises towards the centre and in the centre has a narrower, upwardly projecting central part 17. However, the control element can also be in the form of a thick, flat disk.

Beneath the support 12 are provided areal or planar signal generators 19, whose arrangement is shown in FIG. 2. There are four signal generators 19 as capacitive sensor elements or metallic, circular ring segmental surfaces, for example small metal plates. They are in each case connected to a microprocessor control device 20 for control or evaluation purposes. The arrangement of the control element 14 above signal generator 19 is shown in broken line form in FIG. 2.

The view of the underside 15 of control element 14 in FIG. 3 shows the sensor surfaces 22 provided as circular ring segmental surfaces on a similar circular ring. However, here the subdivision is finer and there are far more sensor surfaces 22, namely ten thereof. These sensor surfaces 22 are per se merely electrically conductive surfaces, for example in the form of small metal plates. They can be embedded or shaped into the underside 15 of control element 14, for example by injection moulding during the production of the control element 14 from plastic. They can also be provided with a thin covering.

As can be seen in FIG. 1, the surfaces as sensor surfaces 22 are connected by electrical connections 23, which are shown here in dotted line form within the control element 14, to circular ring segmental contact surfaces 24 located on top side 16. Like the sensor surfaces 22, the contact surfaces 24 can be constructed in metal plate form, for example from a corresponding, suitable high grade steel or the like for use in the kitchen sector. They can also have a covering or coating. Through the electrical connections 23 the application of a finger 26 to a contact surface 24 acts as if the finger was placed on the corresponding sensor surface 22 or was electrically connected to a surface constructed in the same way as sensor surface 22 and at the same location. Contact of a contact surface 24 with the finger can be looked upon as contact with a sensor surface 22. This can be detected by signal generators 19 located below support 22. Much as is known about other capacitive contact switches, for example, from the aforementioned DE 20 2005 019 978 U1 with through coupling.

FIG. 4 shows how in one position the surfaces of sensor surfaces 22 overlap the surfaces of signal generators 19. The signal generators 19 are shown in broken line and hatched form to make them clearer. Operation takes place with the application of the dotted line finger 26, which corresponds to an operation or contact at this point. As a result of the overlap of sensor surface 22, which is connected to the contacted contact surface with the signal generator 19, it is possible to recognize the overlap at the top left the signal generator 19 and therefore control device 20 can detect a signal change there. Thus, the contacting of contact surface 24 top left with the finger 26 and the signal transmission via sensor surface 22 and the corresponding signal generator 19 capacitively corresponds to a position-related contact or operation. Thus, for example in the case of a hob with four hotplates arranged in a square, the left-hand, rear hotplate can be considered as selected in accordance with the position of signal generator 19, so that it is possible to carry out its subsequent setting, for example the power level. As a result of the finer subdivision of the surfaces of sensor surfaces 22 or by the provision of far more sensor surfaces 22 than signal generators 19, it is ensured that always at least one sensor surface 22 is located in a user-detectable area above signal generator 19 for operation to take place there, for example top left in the arrangement according to FIGS. 4 and 5.

FIG. 5 shows how the contact surfaces 24 are in each case located precisely above a sensor surface 22, where a complete congruence or overlap can occur. However, this need not be the case, because they can also be mutually displaced by the same amount. An equal number of sensor surfaces 22 and contact surfaces 24 is appropriate here.

According to a first, previously described aspect of an inventive control method, as a result of the correspondingly constructed control element 14, it is possible to provide a position-linked operation or control function by the application of a finger 26. It is also possible in this case for the finger 26 to remain in contact at this point during the rotation of control element 14. This can once again be detected by control device 20, because the signal transmitted by the contact migrates in accordance with the rotation over the different signal generators 19. This also makes it possible to link or consequently trigger a corresponding control function.

Alternatively to the substantially flat contact surfaces 24 shown in FIGS. 1 and 4, the contact surfaces can be provided with a trough or depression. This has the advantage that a finger 26 can be inserted in the depression and the control element 14 is rotated solely by means of said externally applied finger 26. This simultaneously ensures that there is always an electrical contact between finger 26 and contact surface 24, which is important for signal detection purposes.

Figure 6:
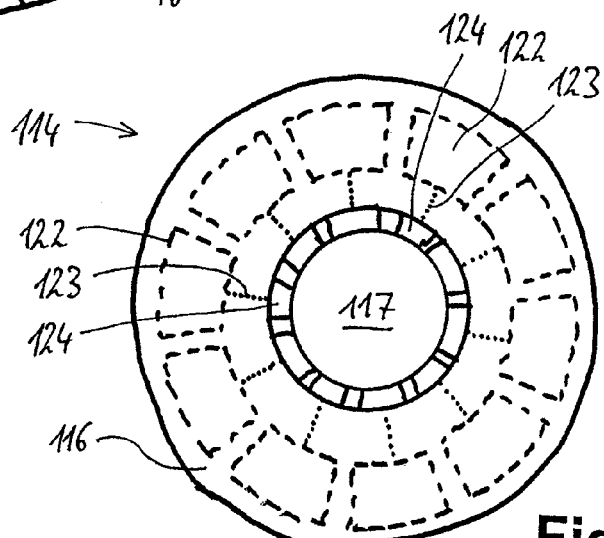
FIG. 6 illustrates a variant of a control element in plan view from above with the contact surfaces on the central part.

According to a further embodiment of the invention shown in FIG. 6, a control element 114 can have circular ring segmental contact surfaces 124 on central part 116 instead of on its top side 1116, as shown in FIGS. 1 and 5. However, this can intensify the problem occurring in the variant of FIG. 5 that the control element 14 must be contacted with two fingers for reliable rotation. As said two fingers are normally applied opposite to one another for reliable griping for rotation purposes, it is no longer possible to bring about an unambiguous detection of the position of an applied finger 26. This can admittedly be used for a control method which detects and correspondingly evaluates the application of a finger on one of the contact surfaces, for example, for a control function differing from a rotation without contact. It is no longer possible in such a case to have a control function via the geometrical association of the application of a finger 26.

However, it is also possible for the rotation of control element 114, as is possible in FIGS. 1 and 5, for an operator to engage with a finger 26 at the desired point on one of the contact surfaces 124 of central part 117 and then the top side 16 with the other finger, without contacting a second contact surface 124, which once again permits a geometrical evaluation.

Figure 7:
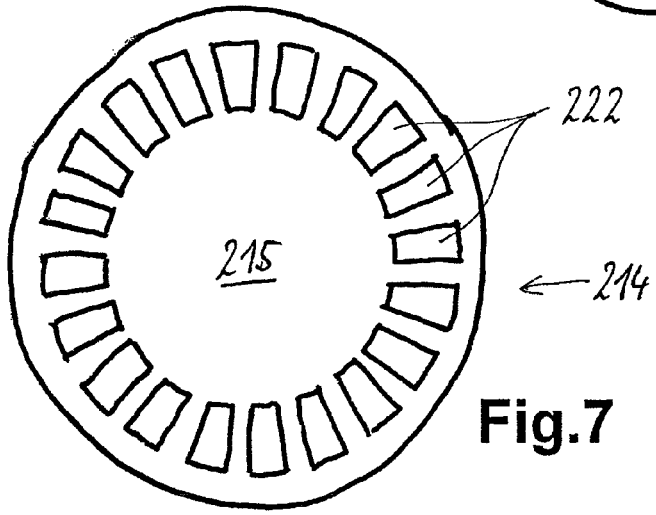
FIG. 7 illustrates a variant of the control element of FIG. 3 with a finer subdivision into narrow sensor surfaces.

A further development of the invention can be gathered from FIG. 7 where, compared with FIG. 3, there is a twice as fine subdivision of sensor surfaces 122, i.e., twenty sensor surfaces 222. This permits an even finer evaluation of the location of finger application on the top of a contact surface on control element 214. It is also possible to avoid a situation according to FIGS. 1 to 3, in which a finger is placed precisely on two juxtaposed contact surfaces and they are for example so positioned between two signal generators that it is not possible to precisely evaluate the one to which the finger is closer.

It is also possible with the control element shown here for a contact surface not to have to be further contacted during rotation of the control element and this only takes place once at the start with respect to a specific function to be triggered or a so-called function or operation mode. As to whether or not the contact is to be maintained then, particularly precisely on said contact surface, or changes to some other contact surface then no longer has any significance, the first contact only being vital. It is also clear to the expert that numerous aspects of the indicated features of a control method can be favourably combined for an advantageous control method.

The invention claimed is:

1. Control device for an electrical appliance, said control device having a control element positioned in a movable and removable manner on a support of said control device, wherein said control element is provided with an underside and with a plurality of sensor surfaces on said underside for a contactless capacitive signal coupling between signal generators on or beneath said support and said sensor surfaces, wherein said sensor surfaces are coupled to contact surfaces on said control element, wherein said contact surfaces are contactable or operable by an operator for a control function by signal coupling at the signal generators, wherein a plurality of said signal generators and said sensor surfaces are provided along corresponding concentric circles on said support and said control element, wherein more of said sensor surfaces are provided as of said signal generators.

2. The control device according to claim 1, wherein a number of said sensor surfaces is at least twice that of said signal generators.

3. The control device according to claim 1, wherein there are at least twelve said sensor surfaces.

4. The control device according to claim 1, wherein said sensor surfaces or said signal generators are uniformly distributed in an equidistant manner from one another.

5. The control device according to claim 1, wherein said concentric circles with said sensor surfaces and said signal generators are of the same size.

6. The control device according to claim 1, wherein said sensor surfaces are positioned along a circle roughly within an outer circumference of said control element.

7. The control device according to claim 1, wherein there is a capacitive signal coupling between said sensor surfaces and said signal generators.

8. The control device according to claim 7, wherein said sensor surfaces are electrically contactable by means of said associated contact surfaces on said control element by means of a finger of said operator contacting said control element, wherein said contact is detectable by said signal generators.

9. The control device according to claim 1, wherein said contact surfaces on said control element are electrically conducting and connected to said sensor surfaces on said control element underside, wherein said sensor surfaces enable said signal coupling to said signal generators.

10. The control device according to claim 9, wherein there is one said contact surface per said sensor surface.

11. The control device according to claim 1, wherein said electrically conductive connection between said sensor surfaces and said contact surfaces is within said control element.

12. The control device according to claim 1, wherein said sensor surfaces and said contact surfaces are formed as radially directed strips.

13. The control device for an electrical appliance, said control device having a control element resting in a movable and removable manner on a support of said control device, wherein said control element is provided with an underside having a plurality of sensor surfaces on said underside for a contactless capacitive signal coupling between signal generators on or beneath said support and said sensor surfaces, wherein said sensor surfaces are coupled to contact surfaces on said control element, wherein said contact surfaces are contactable or operable by an operator for a control function by signal coupling at the signal generators, wherein several said signal generators are provided with said several sensor surfaces along corresponding concentric circles on said support and said control element, wherein more of said sensor surfaces are provided relative to said signal generators, wherein one said signal generator is formed as a capacitive slider with a circular ring form and is positioned at said support.

14. A method for operating a control device for an electrical appliance comprising a plurality of hotplates, said control device having a control element positioned in a movable and removable manner on a support of said control device, wherein said control element is provided with an underside and with a plurality of sensor surfaces on said underside for a contactless capacitive signal coupling between signal generators on or beneath said support and said sensor surfaces, wherein said sensor surfaces are coupled to contact surfaces on said control element, wherein said contact surfaces are contactable or operable by an operator for a control function by signal coupling at the signal generators, wherein a plurality of said signal generators are provided and said sensor surfaces along corresponding concentric circles on said support and said control element, wherein more of said sensor surfaces are provided as of said signal generators, said steps comprising:

determining a user has contacted said control element by a finger of the user using said capacitive signal coupling;

identifying a corresponding one of the plurality of hotplates associated with said control device based on a position said finger has contacted said control element;

determining a movement of said control element by said user, said movement corresponding to an indicated operating power level; and providing said indicated power level to said selected hotplate.

15. The method of claim 14 wherein said finger contacts said control element for the duration of said movement.

16. Method according to claim 14, wherein on moving said control element for setting said power level, said contact surface is no longer contacted for selecting said hotplate.

* * * * *